United States Patent [19]
Chen et al.

[11] Patent Number: 5,831,920
[45] Date of Patent: Nov. 3, 1998

[54] GMR DEVICE HAVING A SENSE AMPLIFIER PROTECTED BY A CIRCUIT FOR DISSIPATING ELECTRIC CHARGES

[75] Inventors: Eugene Chen, Gilbert; Saied N. Tehrani, Tempe; Mark Durlam, Chandler; Peter K. Naji, Tempe, all of Ariz.

[73] Assignee: Motorola, Inc., Schaumburg, Ill.

[21] Appl. No.: 949,605

[22] Filed: Oct. 14, 1997

[51] Int. Cl.⁶ ........................................................ G11C 7/00
[52] U.S. Cl. ........................ 365/225.5; 365/225.5; 365/209; 365/66; 365/55
[58] Field of Search ........................ 365/225.5, 209, 365/66, 55

[56] References Cited

U.S. PATENT DOCUMENTS

| | | | |
|---|---|---|---|
| 3,467,953 | 9/1969 | Harding | 365/209 |
| 3,905,026 | 9/1975 | Sell | 365/213 |
| 4,532,610 | 7/1985 | Gilligan | 365/130 |

*Primary Examiner*—David Nelms
*Assistant Examiner*—VanThu Nguyen
*Attorney, Agent, or Firm*—Eugene A. Parsons

[57] ABSTRACT

A new and improved magnetic device is provided for memories and sensors. A magnetic random access memory (MRAM) device (20) includes a storage element (21) for magnetically storing states and an amplifier (25) for sensing the states stored in the storage element. A circuit (27) for dissipating electrical charges are coupled to inputs (23,24) of the amplifier (25) to discharge electrical charges applied to the inputs (23,24) of the amplifier (25). The charge dissipating circuit (27) includes junctions (271–274) which are typically connected in series between power (255) and common (257) lines. Electric charges applied to the inputs (23,24) of the amplifier (25) is discharged through the junctions (271–274).

20 Claims, 3 Drawing Sheets

5,831,920

GMR DEVICE HAVING A SENSE AMPLIFIER PROTECTED BY A CIRCUIT FOR DISSIPATING ELECTRIC CHARGES

FIELD OF THE INVENTION

The present invention relates to a giant magneto-resistive device, and more particularly, to the giant magneto-resistive device having a sense amplifier protected by a circuit for dissipating electric charges.

BACKGROUND OF THE INVENTION

Giant magneto-resistive (GMR) materials are applied to a magnetic random access memory (MRAM) device and magnetic sensors such as a magnetic transducer for an MR head. The MRAM device forms very high density, non-volatile magnetic, memories utilizing GMR materials for memory elements. Information is stored in the GMR memory elements in the form of orientations of magnetization vectors, which are changed very quickly according to the magnetic field applied to the GMR memory element. The GMR memory element includes a plurality of magnetic and non-magnetic layers, for example, three layers having two magnetic layers with a non-magnetic layer inserted therebetween. The GMR memory elements are arrayed on intersections where word lines cross over sense lines just like a DRAM. Activation of word and sense lines enable the MRAM device to read and write states in a selected or addressed GMR memory element. The MRAM device is highly desirable to be integrated together with other circuits to enhance performances and functions of the device, which typically can be fabricated by a well known CMOS process to meet low-power consumption requirements.

A typical CMOS process includes a final annealing step in order to control and adjust the threshold voltage of MOS transistors. This annealing step is usually processed between 400° and 450° C. in a hydrogen ambience to passivate crystal defects and to relax an internal strain in semiconductor material. GMR materials require processing temperatures to be less than 300° C. because higher temperatures result in interdiffusion between layers and a material performance degradation. Therefore, the final annealing step must be completed before fabrication of GMR memory elements.

Another problem has been found in MOS devices. A gate oxide is ruptured by an over voltage condition caused during a reactive ion etching (RIE) and/or plasma deposition. FIG. 1 shows a section view of part of MOS device 10 for describing a damage mechanism caused by electric charges. A gate oxide 11 on a substrate 12 is coupled to metal area 13, for example, a metal gate contact and a patterned metal wiring. During ion etching, charged ions are collected into the surface of silicon wafers. Some of the charged ions 14 are applied to metal area 13, which acts as an antenna to collect ionized atoms. Consequently positive charges 15 are created in metal area 13 and negative charges 16 are funneled into and accumulated in gate oxide 11. The accumulation of negative charges highly increases electric potential at gate oxide 11, that causes gate oxide 11 to have a catastrophic failure or rupture, this mechanism is described as "charge funneling." This charge funneling can also shift threshold voltage of MOS transistors if the change is not catastrophic, however this threshold shift is not usually detected in the non-catastrophic case because the annealing step seemingly recovers the damages. Thus, MOS device 10 has latent damages in gate oxide 11 which cause the life time of MOS device 10 to shorten.

Accordingly it is a purpose of the present invention to provide an improved MRAM device with a sense amplifier having a circuit for discharging electric charges applied to an input of the sense amplifier.

It is another purpose of the present invention to provide an improved MRAM device with a sense amplifier, an input of which is protected from application of an over voltage.

It is still another purpose of the present invention to provide an improved MRAM device with a sense amplifier in which the threshold voltage of a MOS device in the sense amplifier is prevented from widely scattering.

It is a further purpose of the present invention to provide an improved MRAM device with a sense amplifier in which a MOS device in the sense amplifier is prevented from having a latent failure.

SUMMARY OF THE INVENTION

These needs and others are substantially met through provision of a magnetic memory device having an amplifier protected by a charge dissipating circuit. The magnetic memory device includes a storage element for magnetically storing states and the amplifier for sensing the states stored in the storage element. The charge dissipating circuit is coupled to an input of the amplifier to discharge electric charges applied to the input of the amplifier.

In one embodiment, the charge dissipating circuit includes junctions which are connected between power and common lines.

DETAILED DESCRIPTION OF THE PREFERRED EMBODIMENTS

Figure 1:
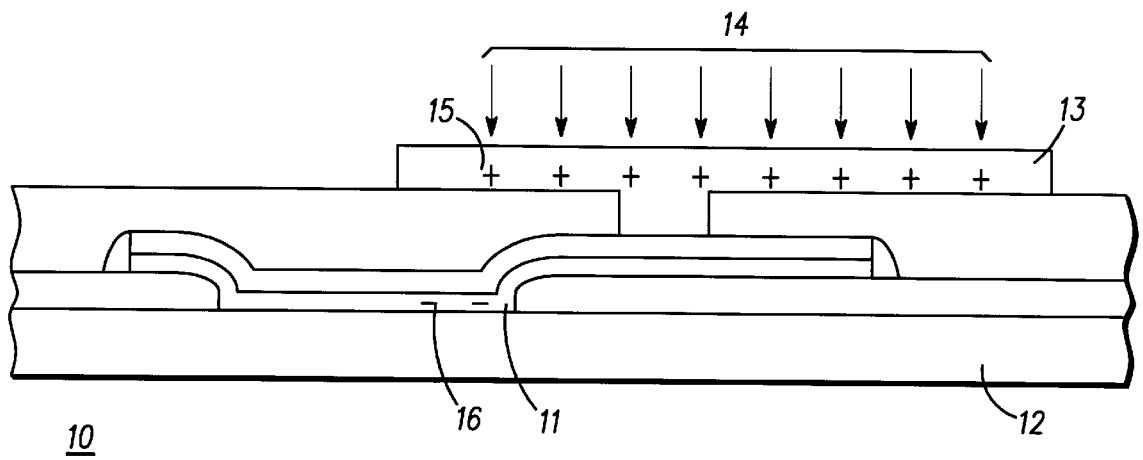
FIG. 1 shows a sectional view of part of a MOS device for describing a damage mechanism caused by electric charges.
Figure 2:
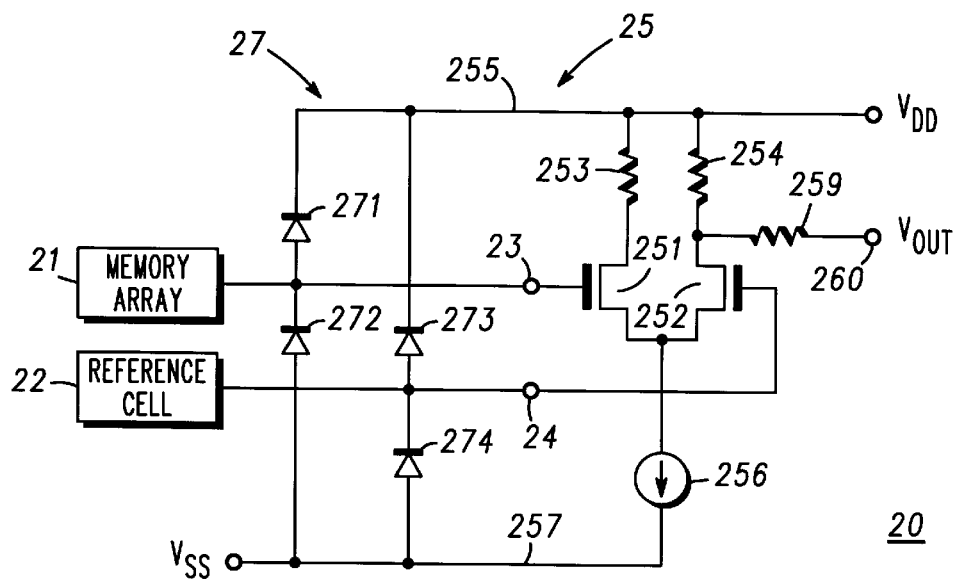
FIG. 2 shows a circuit diagram of a MRAM device in accordance with a present invention.

GMR materials are utilized in various kinds of devices such as memories and sensors. This patent application describes embodiments formed into a MRAM device, for example. It should be understood that the present invention is easily applied to the sensor device instead of the MRAM. FIG. 2 shows a circuit diagram of a MRAM device 20 with a circuit for discharging electric charges or a charge dissipating circuit 27. MRAM device 20 includes a memory array 21 and reference element 22, outputs of which are coupled to inputs 23 and 24 of a sense amplifier 25, respectively. Memory array 21 contains a plurality of storage elements formed by GMR material which typically comprises two magnetic layers separated by a non-magnetic layer. GMR material and an arrangement of storage elements are described, for instance, in U.S. patent applications entitled "FERROMAGNETIC GMR MATERIAL AND METHOD OF FORMING AND USING", filed Nov. 6, 1995, bearing Ser. No. 08/553,933 and entitled "A METHOD OF OPERATING A RANDOM ACCESS MEMORY DEVICE HAVING A PLURALITY OF PAIRS OF MEMORY CELLS AND THE MEMORY DEVICE", filed Oct. 4, 1996, bearing Ser. No. 08/728,023, both are assigned to the same assignee and incorporated by reference herein.

Referring to FIG. 2 again, sense amplifier 25 includes a pair of differential transistors 251 and 252. Gate terminals of transistors 251 and 252 are connected to inputs 23 and 24, respectively. Loads 253 and 254 are connected between differential transistors 251 and 252 and a power line 255, respectively. A current source 256 is connected between source terminals of transistor 251 and 252 and a common potential line 257 for providing a constant current. A node 258 is connected to an output stage 259 which amplifies a voltage at node 258 to provide an output voltage $V_{out}$ of sense amplifier 25 at an output terminal 260.

Charge dissipating circuit 27 is a circuit for discharging electric charges or high positive and negative voltages applied to inputs 23 and 24 of sense amplifier 25, thereby transistors 251 and 252 at an input stage of sense amplifier 25 are protected. As shown in FIG. 2, charge dissipating circuit 27 includes diodes or junctions 271–274 for discharging electric charges. Junction 271 and 272, which protect transistor 251, are connected between power and common lines 255 and 257. Junction 273 and 274, which protect transistor 252, are connected between power and common lines 255 and 257 as well. As mentioned earlier, a reactive ion etching process or plasma processing generates negative charges which flow into gate oxide regions of transistors 251 and 252 without charge dissipating circuit 27, consequently the gate oxide is stressed to an extremely high electric field. Charge dissipating circuit 27 discharges electric charges through junctions 271–274 to power line 255 and common line 257. For instance, when negative charges are developed in metal regions and are transferred to the gate oxide regions of transistors 251 and 252 coupled to the metal regions, the negative charges are discharged through junctions 272 and 274 to common line 257 because the negative charges tend to drop the gate voltage lower than a common voltage $V_{ss}$. Similarly, when positive charges are transferred to the gate oxide regions of transistors 251 and 252, the positive charges are discharged through junctions 271 and 273, thereby the gate potential does not rise over a power voltage ($V_{dd}+V_{junction}$).

Figure 3:
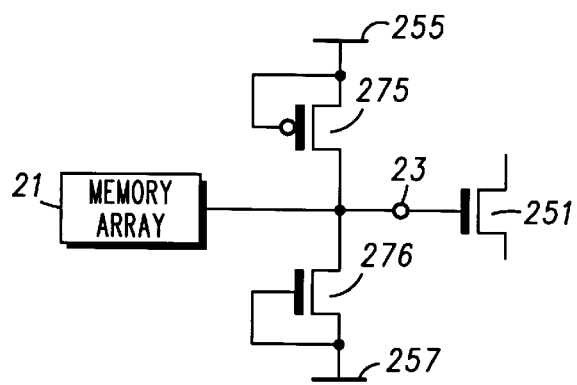
FIG. 3 shows another charge dissipating circuit.
Figure 4:
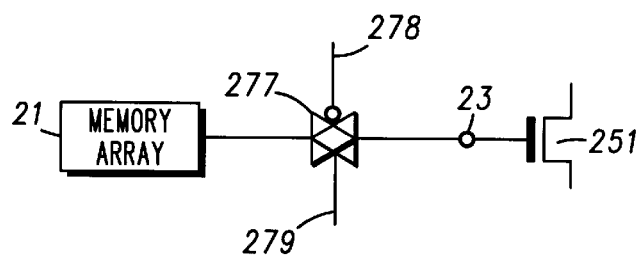
FIG. 4 shows still another charge dissipating circuit.

FIG. 3 illustrates another embodiment of charge dissipating circuit 27 in which junctions 271 and 272 can be replaced by p-channel and n-channel transistors 275 and 276 with a clamp diode connection. Further, as shown in FIG. 4, junctions 271 and 272 can be replaced by a pass or transmission gate 277 connected between memory array 21 and input terminal 23. During a magnetic material process the source/drain junction of N and P transistors in transmission gate 277 act as the clamping diode, thereby accumulation of charges is avoided. During an actual operation gate 277 acts as an analog multiplexer when positive and negative voltages are applied to lines 278 and 279, respectively.

In reading operation of MRAM device 20, one memory storage device (not shown) in memory array 21 is selected and provides an output voltage at input 23. Also reference element 22 gives a reference voltage at input 24. These output voltages are applied to input terminals 23 and 24 as a differential voltage. Sense amplifier 25 detects and amplifies the differential voltage to provide output voltage $V_{out}$ at output terminal 260. When a high output voltage appears at output terminal 260, the memory storage contains a logic "1", for example. A low output voltage at output terminal 260 is evaluated as a logic "0" in the memory storage as well.

Figure 5:
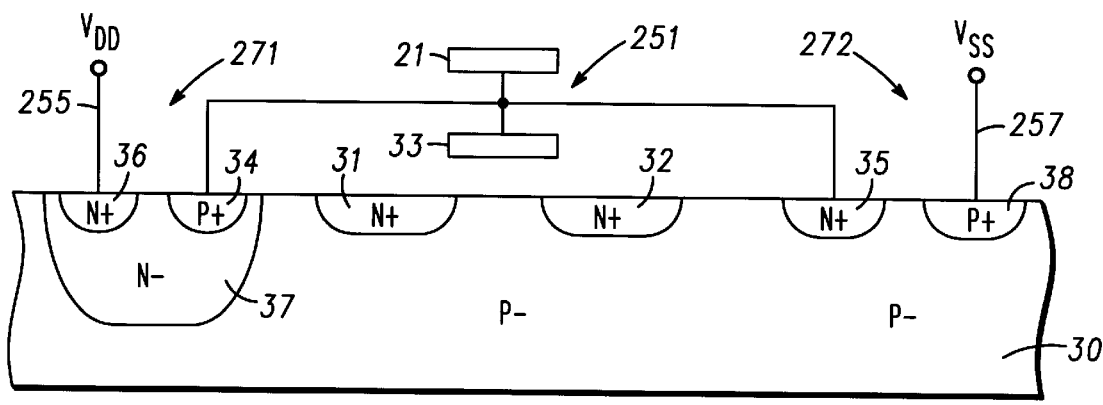
FIG. 5 shows a simplified sectional view of a portion of MRAM device in accordance with the present invention.

FIG. 5 shows a simplified sectional view of a portion of MRAM device 20 shown in FIG. 2 with charge dissipating circuit 27. MRAM device of FIG. 2 can be fabricated under the well known standard CMOS process, for example. For simplicity, transistor 251 and junctions 271 and 272 are illustrated in a P-type semiconductor substrate 30 and an isolation structure like LOCOS is omitted. Transistor 251 is formed by an N+ junction drain region 31, an N+ junction source region 32 and a gate region 33. Gate region 33 is coupled not only to memory array 21 but to a P+ junction anode region 34 of junction 271 and an N+ junction cathode region 35 of junction 272. Junction 271 comprises anode region 34 and a cathode region 36, both in an N– well region 37. Anode 34 and cathode 36 form a p-n junction. Junction 272 also comprises an N+ cathode region 35 and a P+ anode region 38, formed in substrate 30, where a p-n junction is formed therebetween.

As mentioned above, when negative charges are applied to gate region 33, junction 272 allows electric charges to be discharged via N+ cathode region 35 and a P+ anode region 38 to common potential line 257. Further, when positive charges are applied to gate region 33, the charges moves through anode region 34 and cathode region 36 of junction 271 to power line 255. Thus, electric charges applied to gate 33 are dissipated eliminating an electrical overstress condition. Junctions 271 and 272 prevent gate 33 from being damaged by the over voltage condition. Accordingly, the charge dissipating circuit 27 helps the threshold voltage of the input transistor remain constant. In the integration process of magnetic material with CMOS transistors, the CMOS transistors are annealed at 400°–450° C. under hydrogen ambient before magnetic material is deposited.

The damage caused to gate of CMOS transistors is avoided by placing a junction either in series with the metal line going to the gate or placing a junction between the gate terminal and the common line and/or power line.

Figure 6:
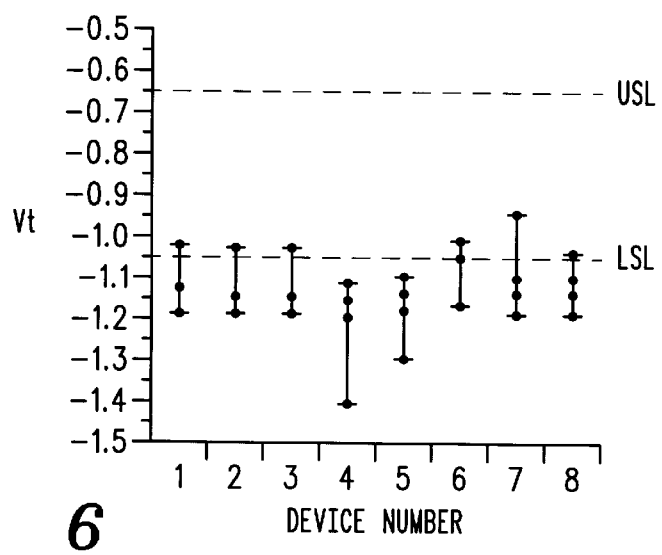
FIG. 6 shows voltage shifts of threshold voltage of P-channel MOS transistors without a charge dissipating circuit after a RIE processing.
Figure 7:
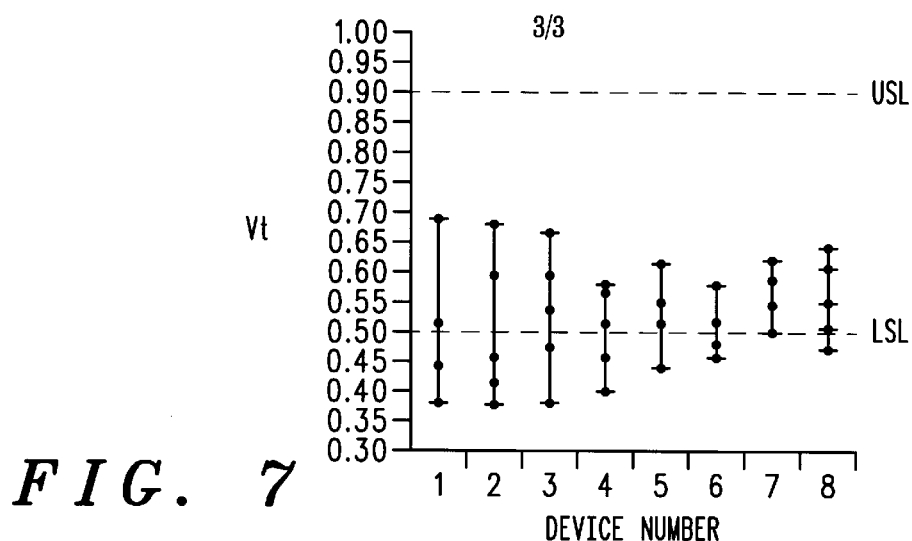
FIG. 7 shows voltage shifts of threshold voltage of N-channel MOS transistors without a charge dissipating circuit after a RIE processing.
Figure 8:
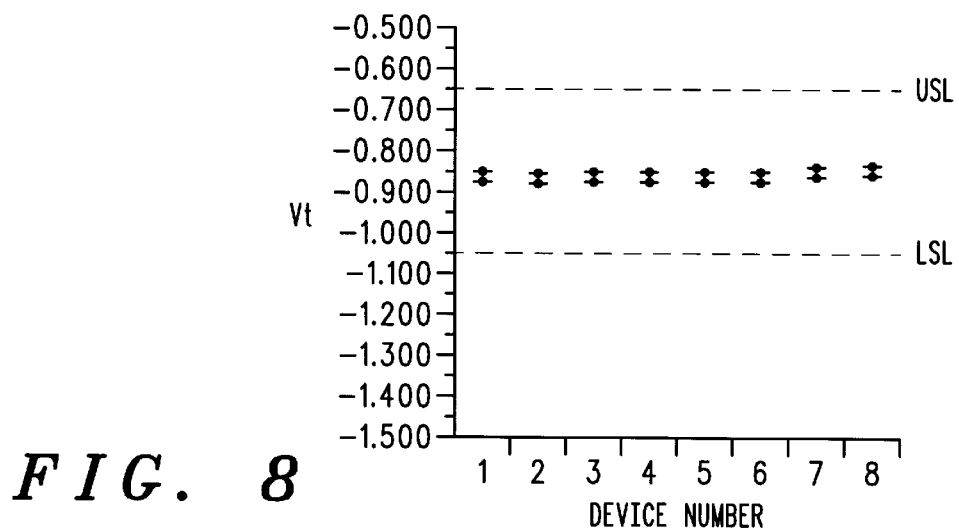
FIG. 8 shows voltage shifts of a threshold voltage of a P-channel MOS transistor with a charge dissipating circuit, before and after a RIE processing.
Figure 9:
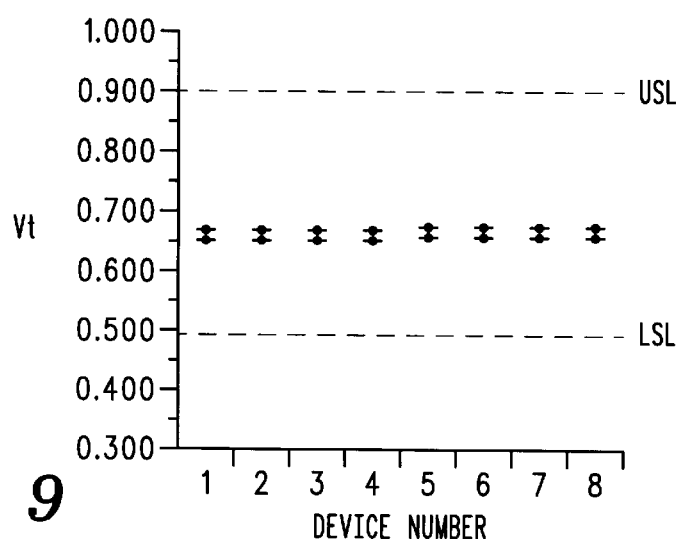
FIG. 9 shows voltage shifts of a threshold voltage of an N-channel MOS transistor with a charge dissipating circuit, before and after a RIE processing.

FIGS. 6 through 9 show how much the threshold voltage is shifted by the presence or absence of a charge dissipating circuit and before and after a magnetic memory processing. The abscissa indicates a threshold voltage of a MOS transistor. The ordinate represents the number of MOS transistors to which a voltage shift of the threshold voltage is examined. As shown in FIGS. 6 and 7, if charge dissipating circuit 27 is not integrated in the MRAM device, the threshold voltage of MOS transistors is widely scattered between –1.40 and –0.95 volts for P-channel transistors and between 0.38 and 0.68 volts for N-channel transistors. However, as clearly appreciated from FIGS. 8 and 9, the voltage shift of the threshold voltage is obviously not present when the input of the MOS transistor is protected by charge dissipating circuit 27.

Thus, an MRAM device protected by a charge dissipating circuit is described. Since the charge dissipating circuit discharges electric charges when the electric charges are funneled to the gate oxide of an input MOS transistor, the gate oxide of the transistor is protected from the over voltage due to the accumulated electric charges. Therefore, the threshold voltage of the MOS transistor remains constant and the MOS transistor is prevented from having a latent failure caused by a RIE processing and/or a plasma processing.

What is claimed is:

1. A magnetic device comprising:
   a magnetic element magnetically changing resistance in magnetic material according to an applied magnetic field;
   an amplifier having an input, the input being coupled to the magnetic element, for sensing resistance in the magnetic element; and
   a charges dissipating circuit, coupled to the input of the amplifier, for dissipating charges applied to the input.

2. The magnetic device as claimed in claim 1 wherein the charge dissipating circuit includes a p-n junction, through which charges dissipate.

3. The magnetic device as claimed in claim 2 wherein the charge dissipating circuit includes a first junction and a second junction, the first junction having an anode coupled to the input of the amplifier and a cathode coupled to a power line, and the second junction having an anode coupled to a common line and a cathode coupled to the input of the amplifier.

4. The magnetic device as claimed in claim 3 wherein the first and second junctions are transistors with a diode connection.

5. The magnetic device as claimed in claim 2 wherein the p-n junction is formed by a transmission gate connected between the magnetic element and the input.

6. The magnetic device as claimed in claim 1 wherein the magnetic element includes a multilayer memory cell having first and second magnetic layers separated by a non-magnetic layer.

7. The magnetic device as claimed in claim 1 wherein the magnetic element includes giant magneto-resistive material.

8. The magnetic device as claimed in claim 1 wherein the magnetic device is integrated on a semiconductor substrate.

9. A magnetic device comprising:
   a magnetic element magnetically changing resistance in magnetic material according to a magnetic field applied to the magnetic element;
   a reference element having a predetermined state;
   an amplifier having a first input and a second input, the first input being coupled to the magnetic element, and the second input being coupled to the reference element, for comparing an output from the magnetic element with an output from the reference element to provide resistance in the magnetic element; and
   a charge dissipating circuit, coupled to the first input and the second input, for dissipating charges applied to the first input and the second input.

10. The magnetic device as claimed in claim 9 wherein the charge dissipating circuit includes a p-n junction, through which charges dissipate.

11. The magnetic device as claimed in claim 9 wherein the charge dissipating circuit includes a first clamp circuit and a second clamp circuit both coupled between a power line and a common line, comprising:
    the first clamp circuit having a first diode and a second diode, the first diode having an anode coupled to the input of the amplifier and a cathode coupled to the power line, and the second diode having an anode coupled to the common line and a cathode coupled to the input of the amplifier, and
    the second clamp circuit having a third diode and a forth diode, the third diode having an anode coupled to the input of the amplifier and a cathode coupled to the power line, and the forth diode having an anode coupled to the common line and a cathode coupled to the input of the amplifier.

12. The magnetic device as claimed in claim 9 wherein the charge dissipating circuit includes a diode, through which charges dissipates.

13. The magnetic device as claimed in claim 11 wherein the first, second, third, and fourth junctions are transistors with a diode connection.

14. The magnetic device as claimed in claim 10 wherein the p-n junction is formed by a transmission gate connected between the magnetic element and the input.

15. The magnetic device as claimed in claim 9 wherein the magnetic element includes a multilayer memory cell having first and second magnetic layers separated by a non-magnetic layer.

16. The magnetic device as claimed in claim 9 wherein the magnetic element includes giant magneto-resistive material.

17. The magnetic device as claimed in claim 9 wherein the magnetic device is integrated on a semiconductor substrate.

18. A magnetic device comprising:
    an array including a plurality of magnetic elements, each element having first and second magnetic layers separated by a non-magnetic layer to magnetically store states in the magnetic layers;
    a reference element having a predetermined state;
    an amplifier having a first input and a second input, the first input being coupled to the array, and the second input being coupled to the reference element, for comparing an output from the magnetic element in the array with an output from the reference element to provide the states in the magnetic element; and
    a charge dissipating circuit including a first clamp circuit and a second clamp circuit both coupled between a power line and a common line for dissipating charges applied to the first input and the second input,
      the first clamp circuit having a first diode and a second diode, the first diode having an anode coupled to the input of the amplifier and a cathode coupled to the power line, and the second diode having an anode coupled to the common line and a cathode coupled to the input of the amplifier, and
      the second clamp circuit having a third diode and a forth diode, the third diode having an anode coupled to the input of the amplifier and a cathode coupled to the power line, and the forth diode having an anode coupled to the common line and a cathode coupled to the input of the amplifier.

19. The magnetic device as claimed in claim 18 wherein the first, second, third, and fourth diodes are transistors with a diode connection.

20. The magnetic device as claimed in claim 18 wherein the magnetic device is integrated on a semiconductor substrate.

* * * * *

UNITED STATES PATENT AND TRADEMARK OFFICE
CERTIFICATE OF CORRECTION

PATENT NO.   : 5,831,920
DATED        : November 3, 1998
INVENTOR(S)  : Chen et al.

It is certified that error appears in the above-identified patent and that said Letters Patent is hereby corrected as shown below:

Column 1,
Line 4, after the Title, please add as a new first paragraph the following paragraph:
  -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*